United States Patent
Huang et al.

(10) Patent No.: US 12,211,741 B2
(45) Date of Patent: Jan. 28, 2025

(54) MULTI-WAFER CAPPING LAYER FOR METAL ARCING PROTECTION

(71) Applicant: Taiwan Semiconductor Manufacturing Company, Ltd., Hsin-Chu (TW)

(72) Inventors: Chih-Hui Huang, Yongkang (TW); Cheng-Hsien Chou, Tainan (TW); Cheng-Yuan Tsai, Chu-Pei (TW); Kuo-Ming Wu, Zhubei (TW); Sheng-Chan Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/506,186

(22) Filed: Nov. 10, 2023

(65) Prior Publication Data
US 2024/0079268 A1   Mar. 7, 2024

Related U.S. Application Data

(60) Continuation of application No. 17/880,787, filed on Aug. 4, 2022, now Pat. No. 11,862,515, which is a
(Continued)

(51) Int. Cl.
*H01L 21/00* (2006.01)
*H01L 21/768* (2006.01)
(Continued)

(52) U.S. Cl.
CPC .. *H01L 21/76834* (2013.01); *H01L 21/76822* (2013.01); *H01L 23/481* (2013.01);
(Continued)

(58) Field of Classification Search
CPC ......... H01L 21/76834; H01L 21/76822; H01L 23/481
See application file for complete search history.

(56) References Cited

U.S. PATENT DOCUMENTS 8,299,583 B2 * 10/2012 Zhu ..................... H01L 27/0694
  438/618
8,841,201 B2 *  9/2014 Teng ....................... H01L 29/06
  438/459
(Continued)

FOREIGN PATENT DOCUMENTS

CN   112750707 A  *  5/2021  ........... H01L 21/187
CN   113178434 A  *  7/2021  ........... H01L 21/187
(Continued)

OTHER PUBLICATIONS

Non-Final Office Action dated Jul. 29, 2022 for U.S. Appl. No. 17/038,198.
(Continued)

*Primary Examiner* — Laura M Menz
(74) *Attorney, Agent, or Firm* — Eschweiler & Potashnik, LLC

(57) ABSTRACT

The present disclosure, in some embodiments, relates to a method of forming an integrated chip structure. The method may be performed by forming a plurality of interconnect layers within a first interconnect structure disposed over an upper surface of a first semiconductor substrate. An edge trimming process is performed to remove parts of the first interconnect structure and the first semiconductor substrate along a perimeter of the first semiconductor substrate. The edge trimming process results in the first semiconductor substrate having a recessed surface coupled to the upper surface by way of an interior sidewall disposed directly over the first semiconductor substrate. A dielectric capping struc-
(Continued)

ture is formed onto a sidewall of the first interconnect structure after performing the edge trimming process.

20 Claims, 9 Drawing Sheets

Related U.S. Application Data division of application No. 17/038,198, filed on Sep. 30, 2020, now Pat. No. 11,610,812.

(60) Provisional application No. 62/928,482, filed on Oct. 31, 2019.

(51) Int. Cl.
| | |
|---|---|
| *H01L 23/00* | (2006.01) |
| *H01L 23/48* | (2006.01) |
| *H01L 23/522* | (2006.01) |
| *H01L 23/528* | (2006.01) |
| *H01L 25/00* | (2006.01) |
| *H01L 25/065* | (2023.01) |

(52) U.S. Cl.
CPC ........ *H01L 23/5226* (2013.01); *H01L 23/528* (2013.01); *H01L 24/80* (2013.01); *H01L 25/0657* (2013.01); *H01L 25/50* (2013.01); *H01L 2224/80986* (2013.01)

(56) References Cited

U.S. PATENT DOCUMENTS

| | | | | |
|---|---|---|---|---|
| 10,388,535 | B1* | 8/2019 | Chiu | H01L 21/304 |
| 10,818,488 | B2* | 10/2020 | Chiang | H01L 21/3043 |
| 10,879,161 | B2* | 12/2020 | Kuo | H01L 23/49838 |
| 11,081,334 | B2* | 8/2021 | Chou | B08B 5/02 |
| 11,127,635 | B1* | 9/2021 | Lin | H01L 27/0688 |
| 11,152,276 | B2* | 10/2021 | Li | H01L 25/0657 |
| 11,335,552 | B2* | 5/2022 | Chang | H01L 29/78696 |
| 11,562,897 | B1* | 1/2023 | Makiyama | H10B 10/12 |
| 11,610,812 | B2* | 3/2023 | Huang | H01L 25/50 |
| 11,715,674 | B2* | 8/2023 | Li | H01L 21/76898 |
| | | | | 257/787 |
| 2008/0044984 | A1* | 2/2008 | Hsieh | H01L 27/14618 |
| | | | | 438/459 |
| 2009/0032847 | A1* | 2/2009 | Tomita | H01L 23/585 |
| | | | | 257/E27.06 |
| 2009/0302480 | A1* | 12/2009 | Birner | H01L 21/76898 |
| | | | | 257/E21.24 |
| 2009/0325343 | A1* | 12/2009 | Lee | H01L 21/2007 |
| | | | | 438/455 |
| 2010/0224876 | A1* | 9/2010 | Zhu | H01L 23/481 |
| | | | | 257/E21.597 |
| 2010/0230818 | A1* | 9/2010 | Birner | H01L 21/76898 |
| | | | | 257/751 |
| 2012/0329277 | A1* | 12/2012 | Zhu | H01L 27/0694 |
| | | | | 438/667 |
| 2015/0014820 | A1* | 1/2015 | Owada | H01L 21/6835 |
| | | | | 257/622 |
| 2015/0200146 | A1* | 7/2015 | Reber | H01L 22/34 |
| | | | | 438/18 |
| 2015/0364432 | A1* | 12/2015 | Chung | H01L 24/94 |
| | | | | 438/109 |
| 2015/0380419 | A1* | 12/2015 | Gunji-Yoneoka | |
| | | | | H01L 29/40114 |
| | | | | 438/594 |
| 2016/0049384 | A1* | 2/2016 | Lu | H01L 21/8221 |
| | | | | 257/737 |
| 2016/0293728 | A1* | 10/2016 | Seo | G03F 7/2002 |
| 2017/0372945 | A1* | 12/2017 | Howard | H01L 21/76898 |
| 2020/0135617 | A1* | 4/2020 | Shen | H01L 27/14634 |
| 2020/0402945 | A1* | 12/2020 | Zeng | H01L 24/32 |
| 2021/0134663 | A1* | 5/2021 | Huang | H01L 25/50 |
| 2021/0134694 | A1* | 5/2021 | Li | H01L 21/76898 |
| 2021/0257339 | A1* | 8/2021 | Yu | H01L 23/3128 |
| 2021/0305205 | A1* | 9/2021 | Hsieh | H01L 24/94 |
| 2021/0384078 | A1* | 12/2021 | Lin | H01L 27/0688 |
| 2022/0068745 | A1* | 3/2022 | Li | H01L 23/481 |
| 2022/0320299 | A1* | 10/2022 | Chen | H01L 21/823475 |
| 2022/0375789 | A1* | 11/2022 | Huang | H01L 21/76822 |
| 2023/0011018 | A1* | 1/2023 | Makiyama | H01L 21/3083 |
| 2023/0021398 | A1* | 1/2023 | Kirkpatrick | H01L 21/67184 |
| 2023/0317541 | A1* | 10/2023 | Li | H01L 21/76898 |
| | | | | 257/787 |
| 2024/0079268 | A1* | 3/2024 | Huang | H01L 23/3185 |

FOREIGN PATENT DOCUMENTS

| | | | | |
|---|---|---|---|---|
| DE | 102020104180 | A1 * | 5/2021 | ............ H01L 21/56 |
| DE | 102020126234 | A1 * | 5/2021 | ............ H01L 21/187 |
| DE | 102020110287 | A1 * | 9/2021 | ............ H01L 21/185 |
| DE | 102020104180 | B4 * | 5/2023 | ............ H01L 21/56 |
| TW | 200414420 | A | 8/2004 | |

OTHER PUBLICATIONS

Notice of Allowance dated Nov. 16, 2022 for U.S. Appl. No. 17/038,198.

Notice of Allowance dated Aug. 18, 2023 for U.S. Appl. No. 17/880,787.

* cited by examiner

MULTI-WAFER CAPPING LAYER FOR METAL ARCING PROTECTION

REFERENCE TO RELATED APPLICATIONS

This Application is a Continuation of U.S. application Ser. No. 17/880,787, filed on Aug. 4, 2022, which is a Divisional of U.S. application Ser. No. 17/038,198, filed on Sep. 30, 2020 (now U.S. Pat. No. 11,610,812, issued on Mar. 21, 2023), which claims the benefit of U.S. Provisional Application No. 62/928,482, filed on Oct. 31, 2019. The contents of the above-referenced Patent Applications are hereby incorporated by reference in their entirety.

BACKGROUND

Multi-dimensional integrated chips are integrated chips that have multiple semiconductor dies vertically stacked onto one another and electrically connected by way of through-substrate-vias (TSVs) extending through one or more of the semiconductor die. As lithographic scaling has become increasingly more difficult, multi-dimensional integrated chips have emerged as an attractive alternative to single die integrated chips (ICs). Multi-dimensional integrated chips offer a number of advantages over single die ICs, such as a small footprint, shorter interconnects between adjacent die, higher device density, and the ability to integrate different types of semiconductor die (e.g., memory, logic, MEMs, etc.) into a single integrated chip structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
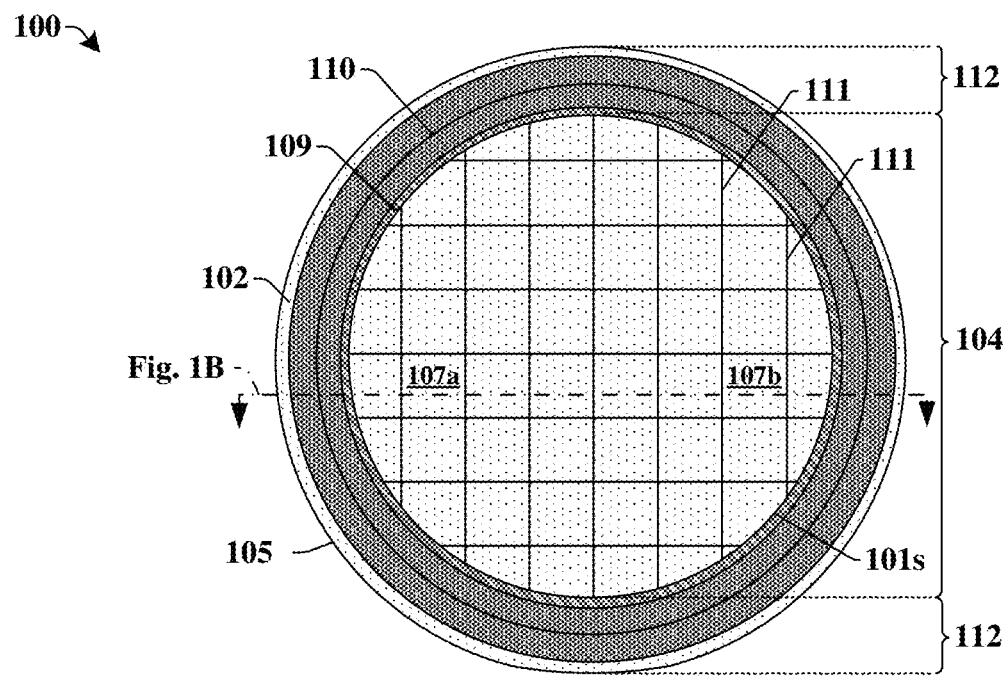
FIGS. 1A-1B illustrate some embodiments of an integrated chip structure having a dielectric capping structure configured to mitigate damage resulting from an edge trimming process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-dimensional integrated chips are formed by stacking a plurality of integrated chips onto one another. During a typical multi-dimensional integrated chip fabrication process a first wafer—a so called "carrier wafer"—is bonded to a second wafer. The carrier wafer is a wafer that has a sufficient thickness to provide mechanical support to the second wafer. After bonding, the second wafer is subsequently thinned to reduce a thickness of the second wafer.

Whether before or after bonding, the outer edge of the first and/or second wafers typically have a circular shape as viewed from above, and have a rounded outer edge as viewed in cross section. As the wafer is thinned, it becomes thinner along the outer edge than in central regions due to the rounded shape. The resulting outer edge has a sharp edge and low mechanical integrity, which can lead to chipping or flaking if the wafer is subsequently grinded down. To prevent such damage to the wafer, edge trimming may be performed. Edge trimming is a process by which an outer edge of the wafer is removed or trimmed. By trimming an outer edge of the wafer, the rounded edge is removed and damage during the grinding process is mitigated.

However, it has been appreciated that trimming the edge of the wafer and/or forming metals, such as forming copper on the wafer through an electrochemical plating process, can leave metal residue on the wafer. This metal residue can lead to risk of arcing, for example during a high power process (e.g., high power etch, thinning of film, or chemical vapor deposition). If arcing occurs, it can damage one or more chips included on the wafer, thereby reducing the yield.

The present disclosure relates to techniques that employ a capping dielectric structure to cover areas where metal residue may be present. For example, in some embodiments, the metal residue and the capping dielectric structure are formed only on the wafer edge. For instance, for a 300 mm wafer having a radius of 150 mm, the metal residue and capping dielectric structure may be formed only on the outermost 4 mm, and may not cover the inner central portion (e.g., remaining radius 146 mm) of the wafer. This capping dielectric structure prevents or limits the risk of arcing during processing, and thereby improves the overall yield compared to previous approaches. In other embodiments, the capping dielectric structure and/or metal residue may cover the entire upper surface of the wafer.

Figure 1B:
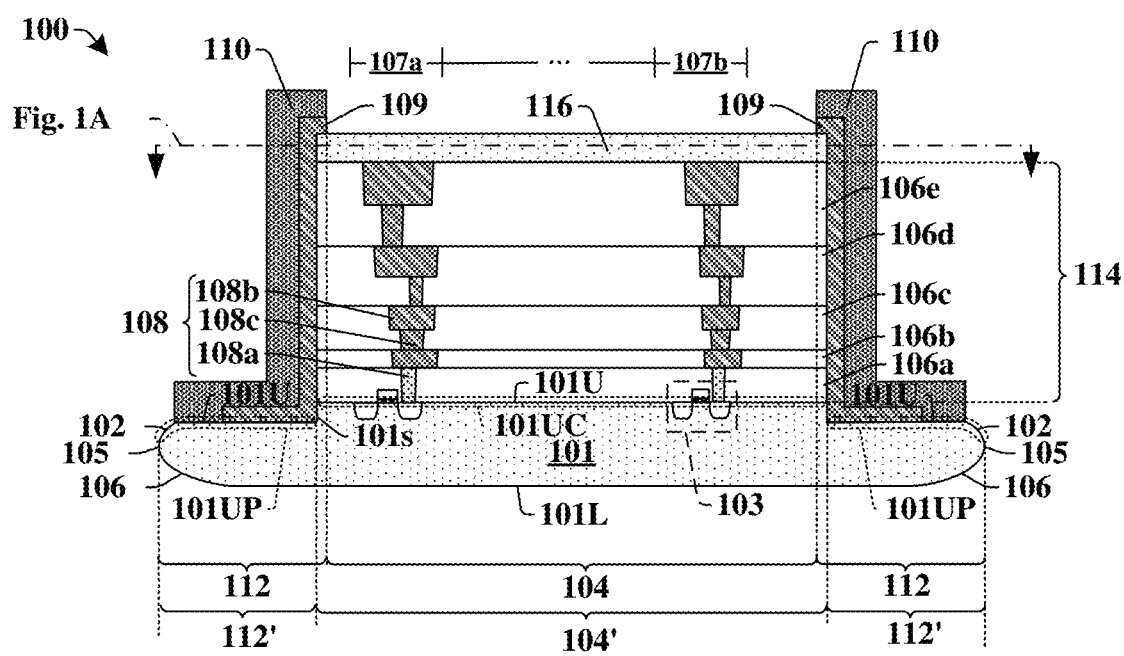

FIGS. 1A-1B, which are now described concurrently, depict a top view and cross-sectional view of a semiconductor wafer structure 100 in accordance with some embodiments. As shown in FIG. 1B, the semiconductor wafer structure 100 includes a semiconductor wafer substrate 101 including an upper face 101U and a lower face 101L whose outermost extents are circumferentially bounded by a circumferential edge region 112. Dies (e.g., 107a, 107b) including active and/or passive circuitry are arranged in grid-like fashion on the wafer, and are separated by scribe lines (e.g., 111). The circumferential edge region 112 includes an upper bevel region 102 extending between the upper face 101U and an outermost edge 105 of the circumferential edge region and a lower bevel region 106 extending between the outermost edge 105 of the circumferential edge region and the lower face 101L. In some instances, the upper bevel region 102 and lower bevel region 106 have the same radius of curvature, though in some cases the upper bevel region 102 is truncated in height relative to the lower bevel region 106. This difference in height can arise, for example, when the upper bevel region 102 and lower bevel region 106 start with equal heights and equal radii of curvatures, and an edge trimming operation is carried out on the upper bevel region 102 (and not on the lower bevel region 106) during processing, for example. This gives rise to a recessed sidewall 101s, which surrounds a central region 104 corresponding to a central upper surface region 101UC of the substrate. In some embodiments, the recessed sidewall 101s may have a first depth that is equal to a difference in height between 101UC and 101UP. In some embodiments, the first depth may greater than or equal to approximately 20 microns.

A plurality of transistor devices 103 can be disposed within the central upper surface region 101UC of the semiconductor wafer substrate 101, and an interconnect structure 114 is disposed over the central upper surface region 101UC. In some embodiments, the interconnect structure 114 may comprise a dielectric structure including a plurality of stacked inter-level dielectric (ILD) layers 106a-106e. In some embodiments (not shown), the plurality of stacked ILD layers 106a-106e may be vertically separated from one another by etch stop layers. In some embodiments, one or more of the plurality of stacked ILD layers 106a-106e may comprise a low-k dielectric layer (i.e., a dielectric layer having a dielectric constant that is less than that of silicon dioxide). In some embodiments, the plurality of stacked ILD layers 106a-106e may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like.

A plurality of conductive interconnect layers 108 are disposed within the dielectric structure over the upper surface of the semiconductor wafer substrate 101. The plurality of conductive interconnect layers 108 are electrically coupled to the plurality of transistor devices 103. In some embodiments, the plurality of conductive interconnect layers 108 may comprise conductive contacts 108a, interconnect wires 108b, and interconnect vias 108c. In some embodiments, the plurality of conductive interconnect layers 108 may comprise copper, tungsten, aluminum, and/or the like.

A metal layer 109 is disposed over at least a portion of the circumferential edge region 112 over the conductive interconnect layers 108. In some cases, the metal layer 109 can be only over the circumferential edge region 112 and not over the central region 104, while in other embodiments the metal layer 109 can extend fully over the central region 104 as well as circumferential edge region 112. Further, in some cases, the metal layer 109 can extend along a sidewall of the interconnect structure 114 and/or a top surface of the interconnect structure 114 and/or the peripheral upper face region 101UP of the substrate 101. In some embodiments, a second semiconductor wafer 116 can be disposed over the interconnect structure 114. Absent countermeasures, the metal layer 109 (which can be a residue that arises from edge trimming, an etching process, an electrochemical plating process, and/or another plating process), provides a potential pathway for high energy arcing that can damage the semiconductor wafer structure 100. The metal layer can comprise copper in some embodiments.

To prevent and/or limit the risk of such arcing, a dielectric capping structure 110 covers an upper surface of the metal layer 109 over at least the portion of the circumferential edge region 112, but does not cover the lower face 101L and does not directly cover a central upper surface region 101UC over the interconnect structure 114. Note that in some cases, the circumferential edge region 112 may correspond to an innermost edge of the dielectric capping structure 110, while in other cases the circumferential edge region 112' may correspond to the recessed sidewall 101s in the upper face of the wafer. In some embodiments, the dielectric capping structure 110 is formed by a low-power process, and comprises silicon oxynitride, silicon nitride, silicon carbide, silicon dioxide, and/or un-doped silicate glass (USG) for example. In some embodiments, the capping dielectric structure 110 is formed only on the peripheral region 112 of the wafer. For instance, for a 300 mm wafer having a radius of 150 mm, the capping dielectric structure 110 may be formed only on the outermost 4 mm, or somewhere between the outermost 3 mm and the outermost 20 mm, and may not cover the central region 104 (e.g., remaining radius 146 mm) of the wafer. This capping dielectric structure 110 prevents or limits the risk of arcing during processing, and thereby improves the overall yield compared to previous approaches. In other embodiments, the capping dielectric structure 110 may cover the entire upper surface of the wafer.

In some cases, the second substrate 116 can separate an upper face of the interconnect structure 114 from the metal layer 109 and/or the dielectric capping structure 110. In other embodiments, the second semiconductor wafer 116 can be omitted, such that the metal layer 109 and/or dielectric capping structure 110 directly contact the upper face 101U (e.g., peripheral upper face region 101UP) and/or a sidewall of the interconnect structure 114 and/or a top surface of the interconnect structure 114. Still further, though FIG. 1B illustrates an example where the dielectric capping structure 110 is a single conformal layer, in other examples the dielectric capping structure 110 may include multiple layers, and these layers can be conformal and/or non-conformal.

Figure 2:
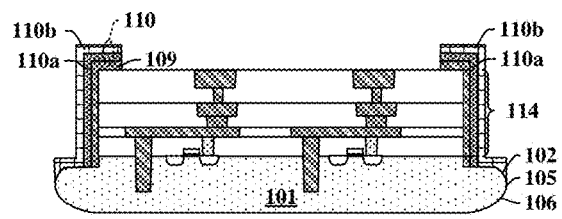
FIGS. 2-7 illustrate cross-sectional views of some alternative embodiments of multi-dimensional integrated chip structures having a dielectric capping structure.

FIG. 2 illustrates another embodiment where the dielectric capping structure 110 has a laminated structure made up of multiple layers. Thus, in FIG. 2's example, the dielectric capping structure 110 includes a first dielectric layer 110a, and a second dielectric layer 110b that can have a different material composition and/or structure from the first dielectric layer 110a. In some cases, the dielectric layers of the laminated structure can include inner sidewalls that are aligned with one another. In some embodiments, the first dielectric layer 110a comprises silicon oxynitride, silicon nitride, silicon carbide, silicon dioxide, and/or un-doped silicate glass (USG) for example. Further, the second dielectric layer 110b can comprise silicon nitride (SixNy) or silicon oxynitride (SixOyNz), for example. It will be appreciated that FIG. 2 is merely a non-limiting example, and in other embodiments, the laminated structure can include additional layers.

Figure 3:
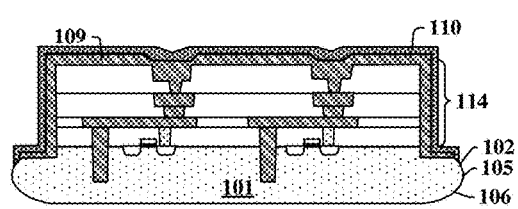

FIG. 3 illustrates another embodiment where the metal layer 109 extends fully over the upper surface of the wafer and along sidewalls of the interconnect structure 114. The dielectric capping structure 110 extends fully over the upper surface of the metal layer 109 and along sidewalls of the metal layer 109 to limit and/or prevent arcing during processing.

Figure 4:
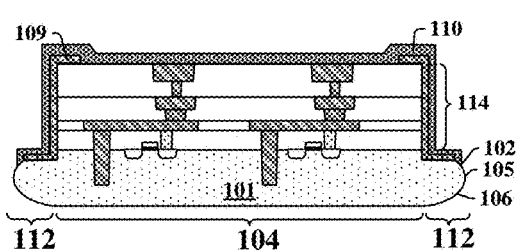

FIG. 4 illustrates another embodiment where the metal layer 109 covers only the peripheral upper surface regions of the interconnect structure 114, sidewalls of the interconnect structure 114, and the peripheral upper surface region 112 of the substrate. Thus, in FIG. 4, the metal layer 109 does not cover a central upper surface region 104 over the interconnect structure. The dielectric capping structure 110 extends fully over the metal residue layer 109, and may have an outer edge that contacts the upper bevel region of the substrate to encapsulate the metal residue 109, thereby further limiting arcing during processing.

Figure 5:
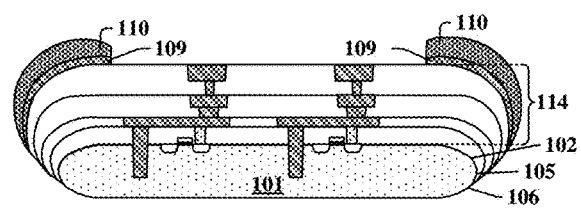

In contrast to FIGS. 1-4, which each depicted a substrate 101 and interconnect structure 114 that had undergone an edge trimming operation prior to the formation of the dielectric capping structure, FIG. 5 depicts an embodiment where an interconnect structure 114 has been formed over the wafer without the use of an edge trimming operation. Thus, in FIG. 5, the substrate 101 includes a lower bevel region 106 as well as an upper bevel region 102 that are fully intact. The interconnect structure 114 is disposed over the upper bevel region 102 of the substrate, and the metal residue 109 is disposed over the dielectric material of the interconnect structure. The dielectric capping structure 110 then surrounds the metal residue 109; such that the metal residue 109 and the dielectric capping structure 110 have cross-sections that each takes the form of a bevel with rounded edges.

Figure 6:
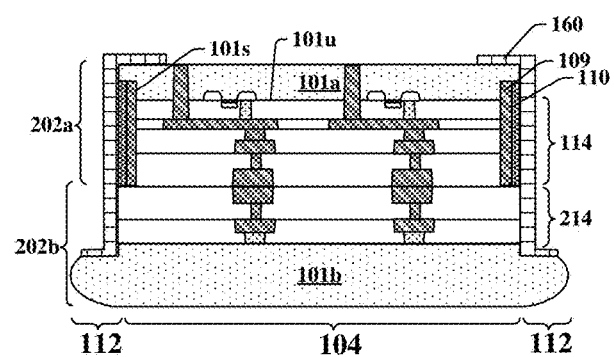

FIG. 6 illustrates a cross-sectional view of some embodiments of a multi-dimensional integrated chip structure having one or more dielectric capping structures. The multi-dimensional integrated chip structure comprises a first tier 202a and a second tier 202b. The first tier 202a comprises a first semiconductor substrate 101a having a central region 104 surrounded by a peripheral region 112. The central region 104 is defined by an upper surface 101u of the first semiconductor substrate 101a. The peripheral region 112 is defined by a location where an outer sidewall 101s of the first semiconductor substrate 101a meets a recessed surface of the first semiconductor substrate 101a. The first tier 202a further comprises a first interconnect structure 114. A metal residue layer 109 and capping dielectric structure 110 are present along sidewalls of the first interconnect structure 114. The second tier 202b comprises a second interconnect structure 214 on a front-side of a second semiconductor substrate 101b. The first interconnect structure 114 is bonded to the second interconnect structure 214.

A second dielectric capping structure 160 is disposed on a recessed surface of the second semiconductor substrate 101b and along the outer sidewall 102s of the recessed portion of the second semiconductor substrate 101b, along an outer sidewall of the second interconnect structure 214, along an outer sidewall of the first dielectric capping structure 110, and along an outer sidewall and over an upper surface (backside) of the first semiconductor substrate 101a. In some embodiments, the first dielectric capping structure 110 comprises silicon oxynitride, silicon nitride, silicon carbide, silicon dioxide, and/or un-doped silicate glass (USG) for example; and the second dielectric capping structure 160 comprises silicon oxynitride, silicon nitride, silicon carbide, silicon dioxide, and/or un-doped silicate glass (USG) for example. The first dielectric capping structure 110 can have the same material composition as the second dielectric capping structure 160, or can have a different material composition from the second dielectric capping structure 160, depending on the implementation.

Figure 7:
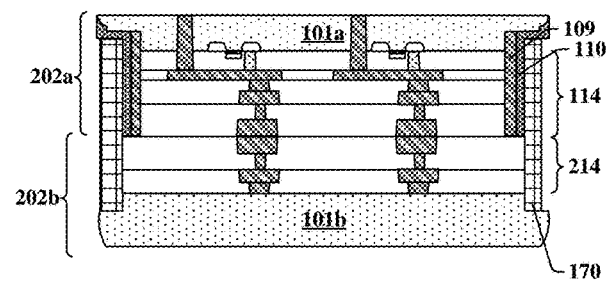

FIG. 7 illustrates a cross-sectional view of some embodiments of a multi-dimensional integrated chip structure having one or more dielectric capping structures, including a second dielectric capping structure 170. In contrast to FIG. 6, the second dielectric capping structure 170 in FIG. 1 is contained entirely between outermost edges of the first semiconductor substrate 101a and second semiconductor substrate 101b, and does not extend past an upper or lower surface of the first semiconductor substrate 101a or second semiconductor substrate 101b. As with FIG. 6, the first dielectric capping structure 110 can have the same material composition as the second dielectric capping structure 170, or can have a different material composition from the second dielectric capping structure 170, depending on the implementation. In some embodiments, the first dielectric capping structure 110 comprises silicon oxynitride, silicon nitride, silicon carbide, silicon dioxide, and/or un-doped silicate glass (USG) for example; and the second dielectric capping structure 170 comprises silicon oxynitride, silicon nitride, silicon carbide, silicon dioxide, and/or un-doped silicate glass (USG) for example.

FIGS. 8-15 illustrate cross-sectional views 800-1500 of some embodiments of various methods of forming an integrated chip structure having one or more dielectric capping structure(s). Although FIGS. 8-15 are described in relation to various methods, it will be appreciated that the structures disclosed in FIGS. 8-15 are not limited to such methods, but instead may stand alone as structures independent of the methods.

Figure 8:
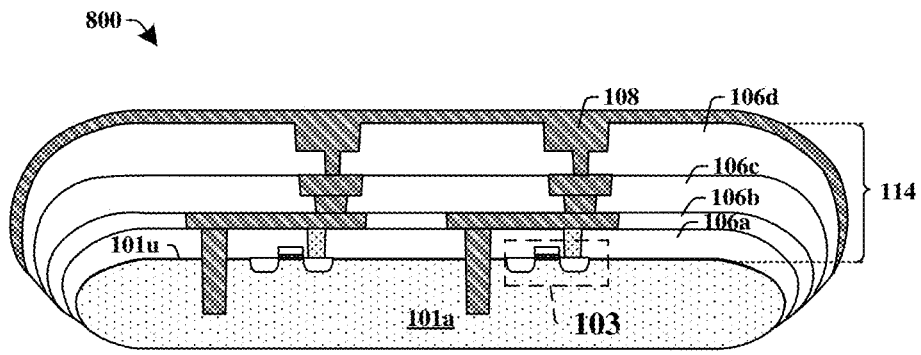
FIGS. 8-15D illustrate a series of cross-sectional views that collectively depict some embodiments of methods of forming an integrated chip structure having a dielectric capping structure configured to mitigate micro arcing.

As shown in cross-sectional view 800 of FIG. 8, one or more transistor devices 103 are formed within a first semiconductor substrate 101a. In various embodiments, the first semiconductor substrate 101a may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the transistor devices 103 may comprise a transistor formed by depositing a gate dielectric film and a gate electrode film over the first semiconductor substrate 101a. The gate dielectric film and the gate electrode film are subsequently patterned to form a gate dielectric and a gate electrode. The first semiconductor substrate 101a may be subsequently implanted to form a source region and a drain region within the first semiconductor substrate 101a on opposing sides of the gate electrode.

After formation of the transistor devices 103, a first interconnect structure 114 is formed over an upper surface 101u of the first semiconductor substrate 101a. The first interconnect structure 114 comprises a dielectric structure having one or more stacked ILD layers 106a-106d respectively surrounding one or more conductive interconnect layers 108. In some embodiments, the first interconnect structure 114 may be formed by forming an ILD layer over the first semiconductor substrate 101, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench to fill the opening, and performing a planarization process (e.g., a chemical mechanical planarization process). In some embodiments, the ILD layer may comprise one or more of silicon dioxide, doped silicon dioxide (e.g., carbon doped silicon dioxide), silicon oxynitride, borosilicate glass (BSG), phosphoric silicate glass (PSG), borophospho silicate glass (BPSG), fluorinated silicate glass (FSG), or the like. Subsequent ILD layers are then formed in turn, and via openings and metal line/wiring openings are formed within each ILD layer. A metal (e.g., 108) is then deposited over the entire surface of a given ILD layer to fill the via openings and metal line/wiring openings.

Figure 9:
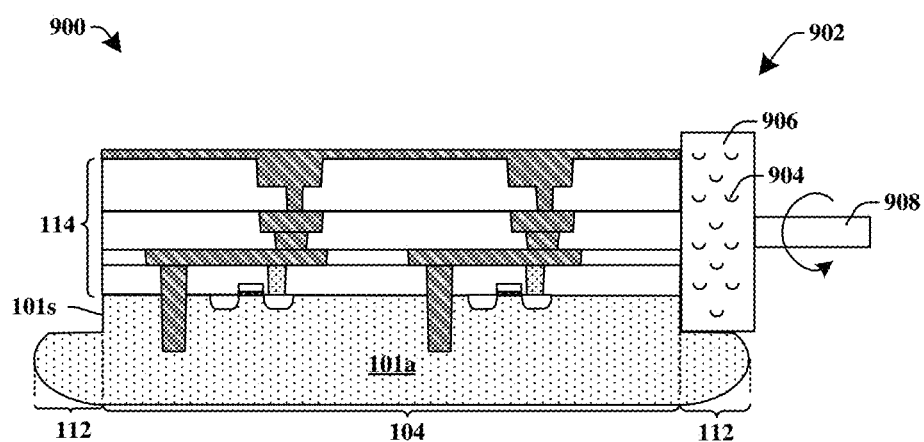

As shown in cross-sectional view 900 of FIG. 9, an edge trimming process is then performed. The edge trimming process removes parts of the first semiconductor substrate 101a and the first interconnect structure 114 along a perimeter of the first semiconductor substrate 101a. By removing parts of the first semiconductor substrate 101, the edge trimming process defines a central region 104 and a recessed peripheral region 112 of the first semiconductor substrate 101a. In some embodiments, the recessed region peripheral 112 is defined by a recessed surface coupled to the upper surface 101u by an outer sidewall 101s of the first semiconductor substrate 101a.

In some embodiments, the edge trimming process may be performed by bringing a blade 902 into contact with the first semiconductor substrate 101a and the first interconnect structure 114 along a closed loop that extends along a perimeter of the first semiconductor substrate 101a. The blade 902 has abrasive elements 904 (e.g., diamond particles) bonded to a core 906 having a circular cross-section. The core 906 is configured to rotate around an axis 908, as the abrasive elements 904 are brought into contact with the first semiconductor substrate 101a and the first interconnect structure 114.

Figure 10A:
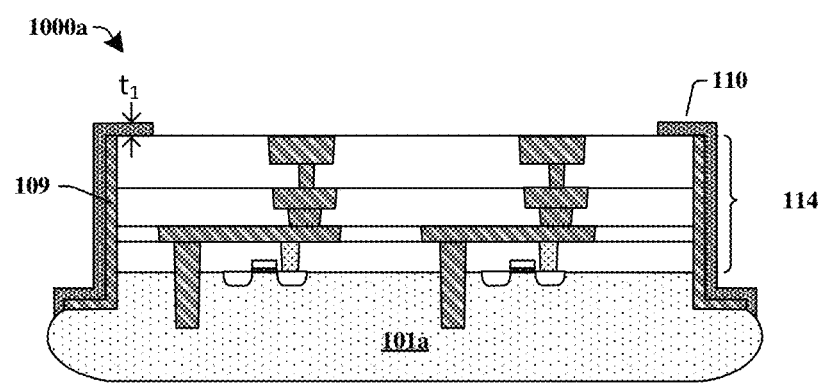

As shown in cross-sectional view 1000a of FIG. 10A, subsequent processing, such as chemical mechanical planarization (CMP) operation can form a metal residue layer 109 over the structure. In some embodiments, the metal residue layer 109 may be a layer that completely covers the ILD structure of the interconnect 114, but in other embodiments, the metal residue layer 109 is "blotchy" or "patchy", meaning that the metal residue layer includes a series of patches or blotches that cover at least part of the upper surface and sidewalls, but do not cover the entire upper surface and sidewalls. For example, the metal residue can include patches of different shapes and size (e.g., random shapes and sizes) that cover between 10% and 90% of the surface are of the upper surface and sidewalls of the interconnect structure 114 in some embodiments. In other embodiments, such as in the illustrated embodiments, the metal residue can cover 100% of the surface are of the upper surface and sidewalls; and in other embodiments the metal residue may not be present.

Figure 17A:
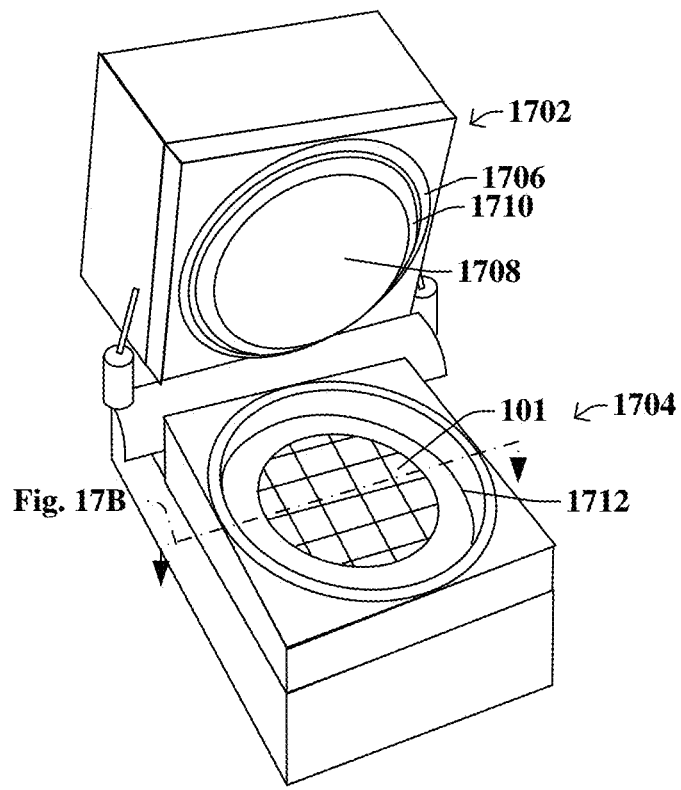
FIGS. 17A-17B illustrate a cross-sectional view and top views of some embodiments of a semiconductor wafer and a processing tool having an upper plasma exclusion zone (PEZ) ring and a lower PEZ ring.
Figure 17B:
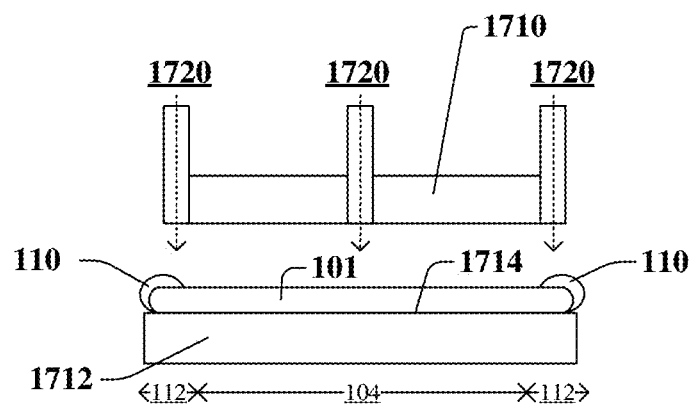

To prevent this metal residue layer 109 from promoting arcing during subsequent high-energy processing, a dielectric capping structure 110 is formed along an outermost sidewall of the first interconnect structure 114 defined by the edge trimming process, and may cover an upper surface of the metal residue layer 109. In some embodiments, the dielectric capping structure 110 may also be formed onto a sidewall of the first semiconductor substrate 101a. In some embodiments, the dielectric capping structure 110 comprises silicon oxynitride, silicon nitride, silicon carbide, silicon dioxide, and/or un-doped silicate glass (USG) for example. In some embodiments, the dielectric capping structure 110 may be deposited by way of a low-power process, such as a lower power deposition that uses a power ranging from 100 Watts (W) to 300 W. For example, the dielectric capping structure may comprise un-doped silicate glass (USG), silicon nitride (SixNy), or silicon oxynitride (SixOyNz), formed by such a low-power process. In some embodiments, the metal residue layer 109 and/or capping dielectric layer 110 can be formed in a bevel deposition apparatus, such as shown in FIGS. 17A-17B, which is described further herein.

In some embodiments, after the dielectric capping structure 110 has been formed, the dielectric capping structure 110 may be exposed to a high power process that is prone to arcing. Thus, the dielectric capping structure 110 has a thickness and/or density that offers a sufficient resistance to arcing to protect the wafer from arcing damage. In some embodiments, the first thickness $t_1$ of the dielectric capping structure 110 is greater than or equal to approximately 200 Angstroms. A first thickness $t_1$ that is greater than or equal to approximately 200 Angstroms is able to isolate the interconnect structure 114 from arcing during subsequent processing. In some such embodiments, the first thickness $t_1$ is in a range of between approximately 200 Angstroms and approximately 2000 Angstroms. In other embodiments, the first thickness $t_1$ of the dielectric capping structure 110 may be greater than or equal to approximately 500 Angstroms, greater than or equal to approximately 750 Angstroms, or greater than or equal to approximately 1000 Angstroms. In some such embodiments, the dielectric capping structure 110 may completely cover or only partially cover the first semiconductor substrate 101a and the first interconnect structure 114.

Figure 10B:
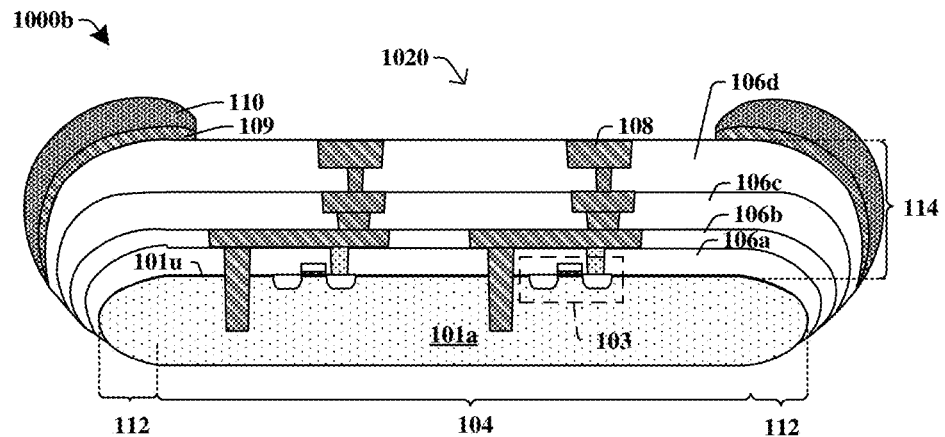

As shown in cross-sectional view 1000b of FIG. 10B, in other embodiments (shown in cross-sectional view of FIG. 10B, which is an alternate embodiment that proceeds from FIG. 8), the edge trimming operation from FIG. 9 may be skipped, and the metal residue layer 109 and/or dielectric capping structure 110 may be formed by way of a bevel deposition process. In such embodiments the dielectric capping structure 110 is formed over an outer region of the first semiconductor substrate 101a and over and along sidewalls of the interconnect structure 114, but not over a center of the first semiconductor substrate 101a. The resulting dielectric capping structure 110 comprises one or more inner sidewalls that define an opening 1020 over the first interconnect structure 114. The metal residue may also be formed during a bevel deposition operation, such that the metal residue is also formed over the outer region of the first semiconductor substrate but not over the center of the first semiconductor substrate 101a.

Figure 10C:
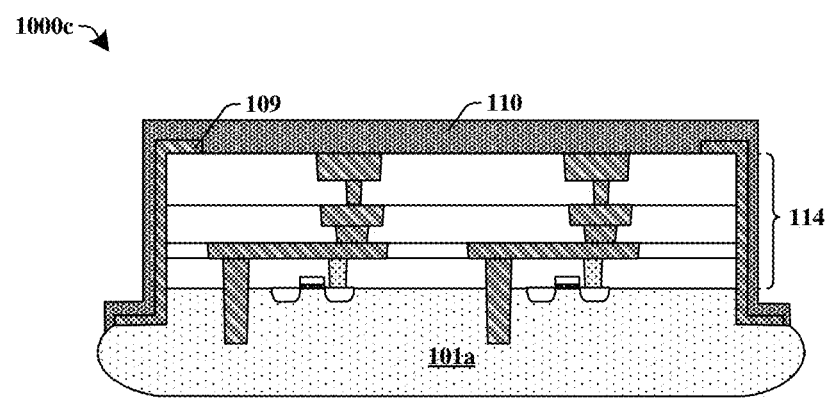

As shown in cross-sectional view 1000c of FIG. 10C, in still other embodiments (shown in cross-sectional view of FIG. 10C, which is an alternate embodiment that proceeds from FIG. 9), an edge trimming operation is used on the interconnect structure, and the metal residue may again be formed during a bevel deposition operation, such that the metal residue is formed over the outer region of the first semiconductor substrate but not over the center of the first semiconductor substrate 101a. The dielectric capping structure 110 may be formed to cover an entire top surface of the structure. In such embodiments, the dielectric capping structure 110 is formed over an outer region of the first semiconductor substrate 101a, and over a center of the first semiconductor substrate 101a.

Figure 10D:
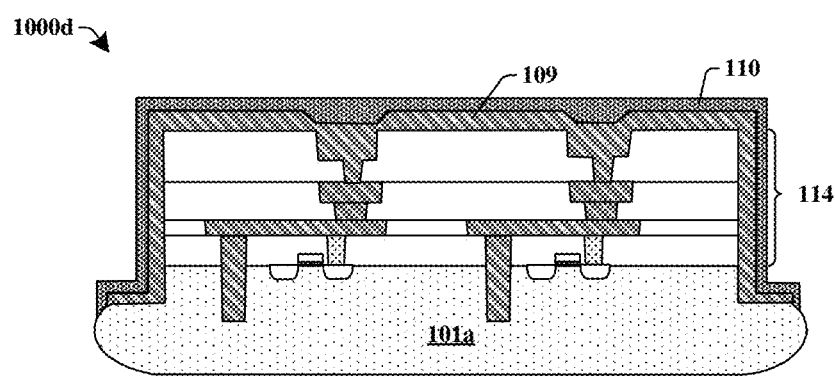

As shown in cross-sectional view 1000d of FIG. 10D, in still other embodiments (shown in cross-sectional view of FIG. 10D, which is an alternate embodiment that proceeds from FIG. 9), the metal residue covers the dielectric capping structure 110 may be formed to cover an entire top surface of the structure. In such embodiments, the dielectric capping structure 110 is formed over an outer region of the first semiconductor substrate 101a, and over a center of the first semiconductor substrate 101a.

Figure 11:
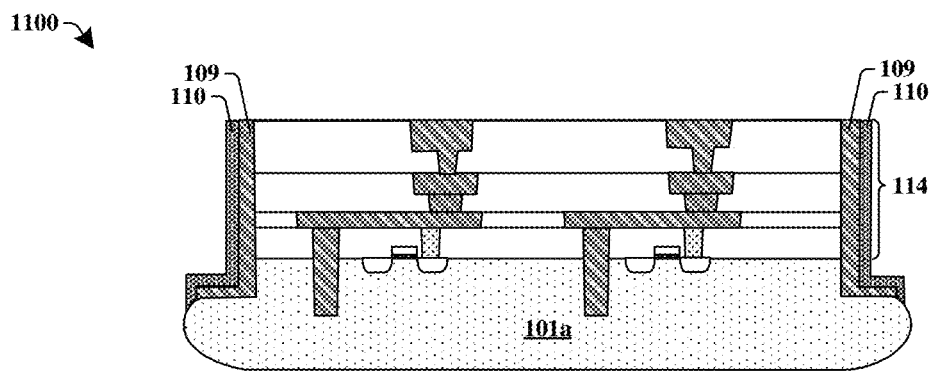

As shown in cross-sectional view 1100 of FIG. 11, a chemical mechanical planarization (CMP) operation is carried out to planarize the dielectric capping structure 110 and metal residue layer 109. Thus, the CMP operation can follow from FIG. 10A-10D, and the illustrated structure of FIG. 11 is consistent with some embodiments that follow from FIG. 10A, FIG. 10C, and/or FIG. 10D.

Figure 12:
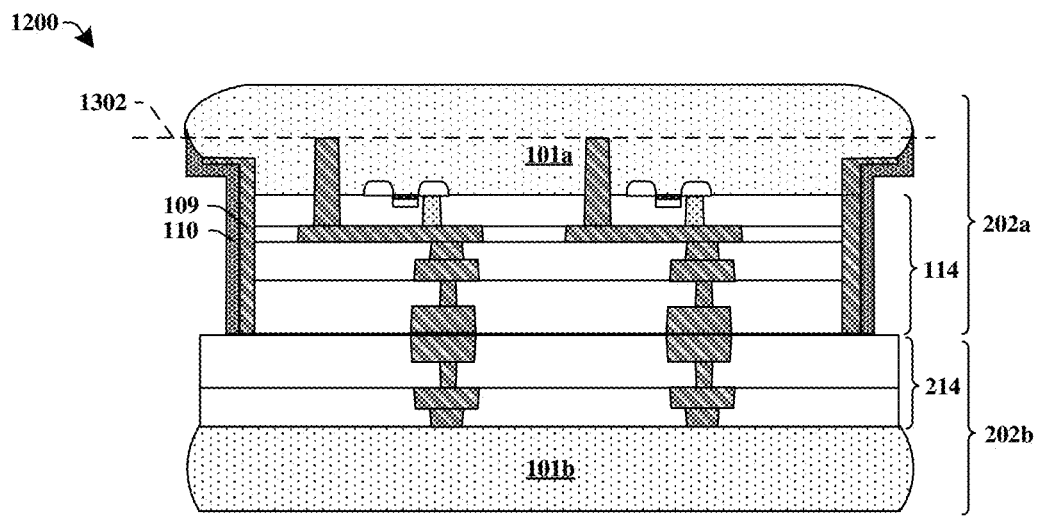

As shown in cross-sectional view 1200 of FIG. 12, the first semiconductor substrate 101a is bonded to a second semiconductor substrate 101b to form a multi-tier semiconductor structure having a first tier 202a and a second tier 202b. In some embodiments, the first semiconductor substrate 101a is bonded to the second semiconductor substrate 101b by way of the first interconnect structure 114 and second interconnect structure 214. The metal residue layer 109 and/or dielectric capping layer 110 may also have a planarized upper surface that contacts the upper surface of the second interconnect structure 214.

Figure 13:
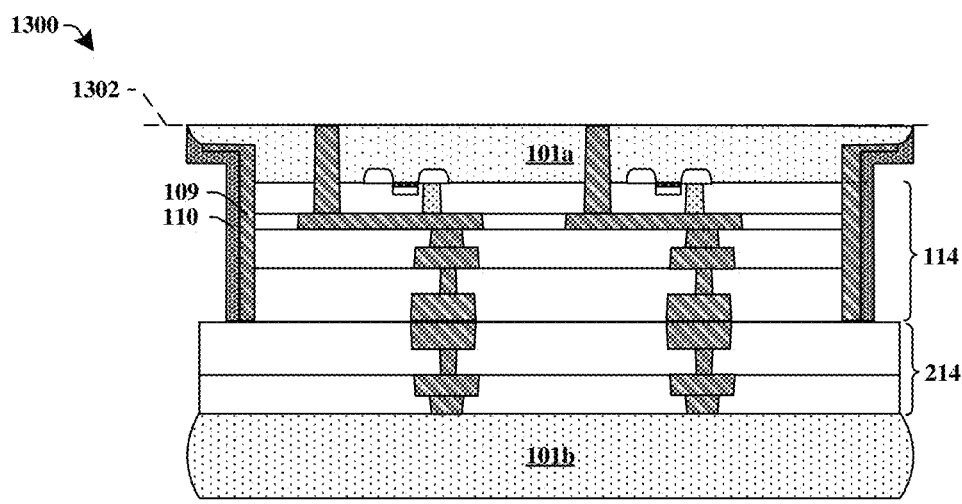

As shown in cross-sectional views 1200-1300 of FIGS. 12-13, the first semiconductor substrate 101a is then thinned (see lines 1302 in FIGS. 12-13). In various embodiments, the first semiconductor substrate 101a may be thinned by etching and/or mechanical grinding a back-side of the first semiconductor substrate 101a along line 1302. In some embodiments, the first semiconductor substrate 101a may be thinned by a first grinding process, a subsequent second grinding process, and a chemical mechanical polishing (CMP) process. In some embodiments, the first grinding process may achieve a first surface roughness, the second grinding process may achieve a second surface roughness that is less than the first surface roughness, and the CMP process may achieve a third surface roughness that is less than the second surface roughness.

Figure 14:
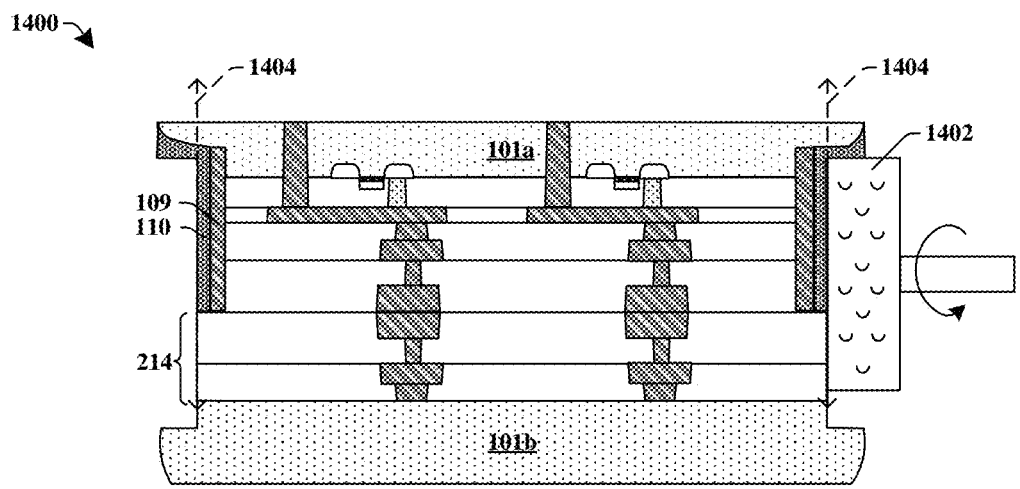

As shown in cross-sectional view 1400 of FIG. 14, a second edge trimming process is performed to remove upper parts of the second semiconductor substrate 101b and the second interconnect structure 214 along a perimeter of the structure. In some embodiments, the edge trimming process may be performed by bringing a blade 1402 into contact with these features. As indicated by lines 1404, in some cases this second edge trimming process may also extend up to remove perimeter portions of the first semiconductor substrate 101a, resulting in outermost sidewalls of the first semiconductor substrate being flush with outermost sidewalls of the second interconnect structure 214 and dielectric capping layer 110.

Figure 15A:
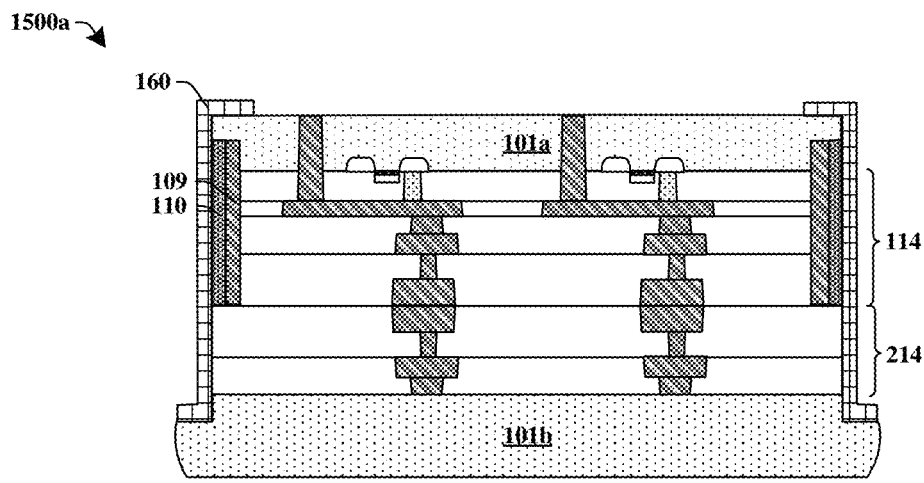

As shown in cross-sectional view 1500a of FIG. 15A, in some embodiments the edge trimming process can trim the outer edge of the first semiconductor substrate 101a to be flush with sidewalls of the first dielectric capping structure 110. Then, a second dielectric capping structure 160 is formed along sidewalls of the second interconnect structure 214. In some embodiments, the second dielectric capping structure 160 may also be formed on sidewalls of the first semiconductor substrate 101a and/or along a recessed surface of the second semiconductor substrate 101b defined by the edge trimming process.

Figure 15B:
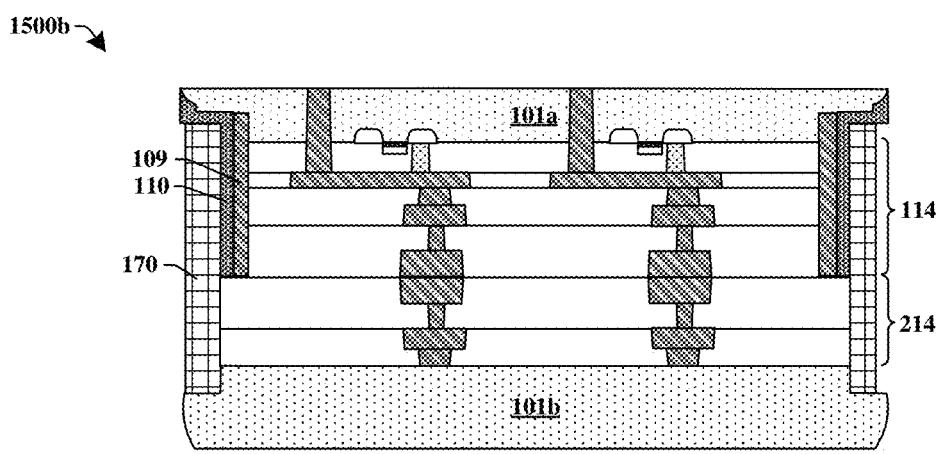

As shown in cross-sectional view 1500b of FIG. 15B, which shows an alternative embodiment that proceeds from FIG. 14, the second edge trimming process can also leave an outer edge of the first semiconductor substrate 101a to overhang the outer sidewall of the first dielectric capping structure 110. Thus, a second dielectric capping structure 170 can be formed along sidewalls of the first interconnect structure 114 and along sidewalls of the second interconnect structure 214 between bevel regions of the first substrate 101a and second substrate 101b.

Figure 15C:
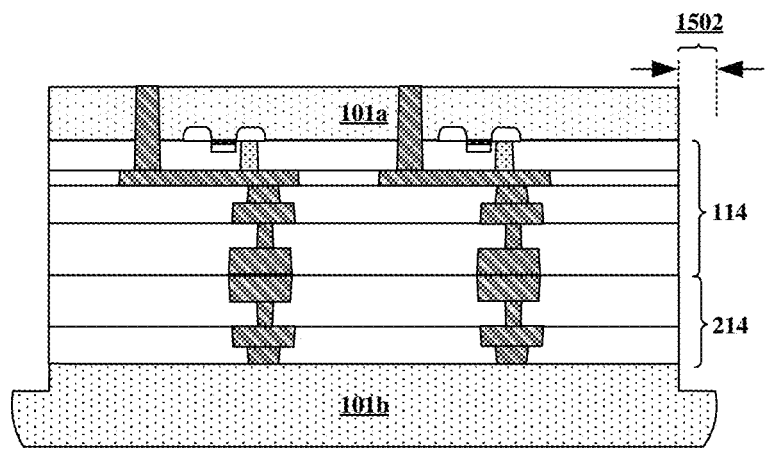

As shown in cross-sectional view 1500c of FIG. 15C, in some cases the second substrate 101b as well as the second interconnect structure 214 and optionally the first interconnect structure 114 have been edge trimmed. This edge trimming in some cases can provide an offset 1502 such that outer sidewalls of the first substrate 101a are recessed by a distance, for example ranging from about 1 mm to about 2 mm (and being about 1.5 mm in some examples), from the outer sidewalls of the second substrate 101b to help limit cracking that could otherwise arise from wafer vibration.

Figure 15D:
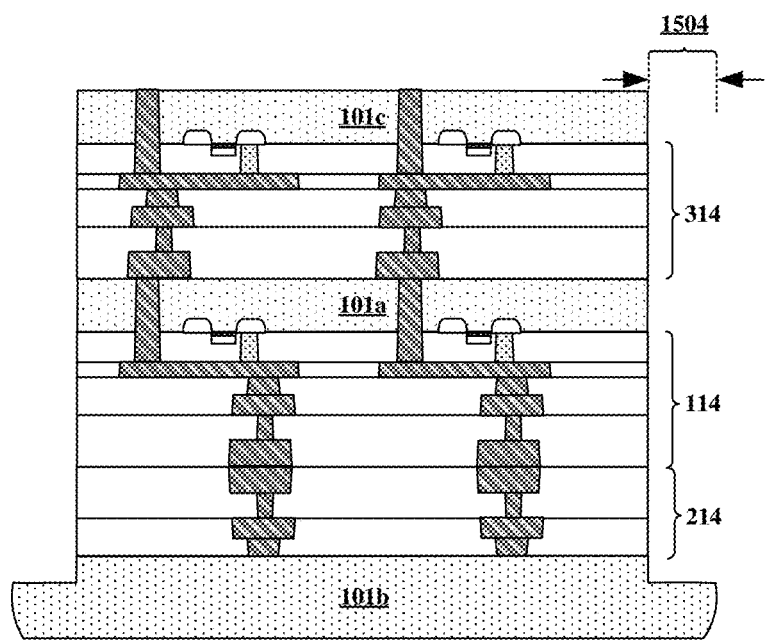

As shown in cross-sectional view 1500d of FIG. 15D, in some cases one or more additional substrates, such as a third substrate 101C and third interconnect structure 314 can be stacked over the first substrate 1011. Edges of the third substrate 101c and third interconnect structure 314 can be trimmed with the second substrate 101a and optionally second interconnect structure 214 (and/or portion of second substrate 101b), such that there is an offset 1504 between outer sidewalls of the first substrate 101a are recessed by a distance, for example ranging from about 1 mm to about 3 mm (and being about 2.0 mm in some examples) from the outer sidewalls of the third substrate 101c to help limit cracking that could otherwise arise from wafer vibration.

Figure 16:
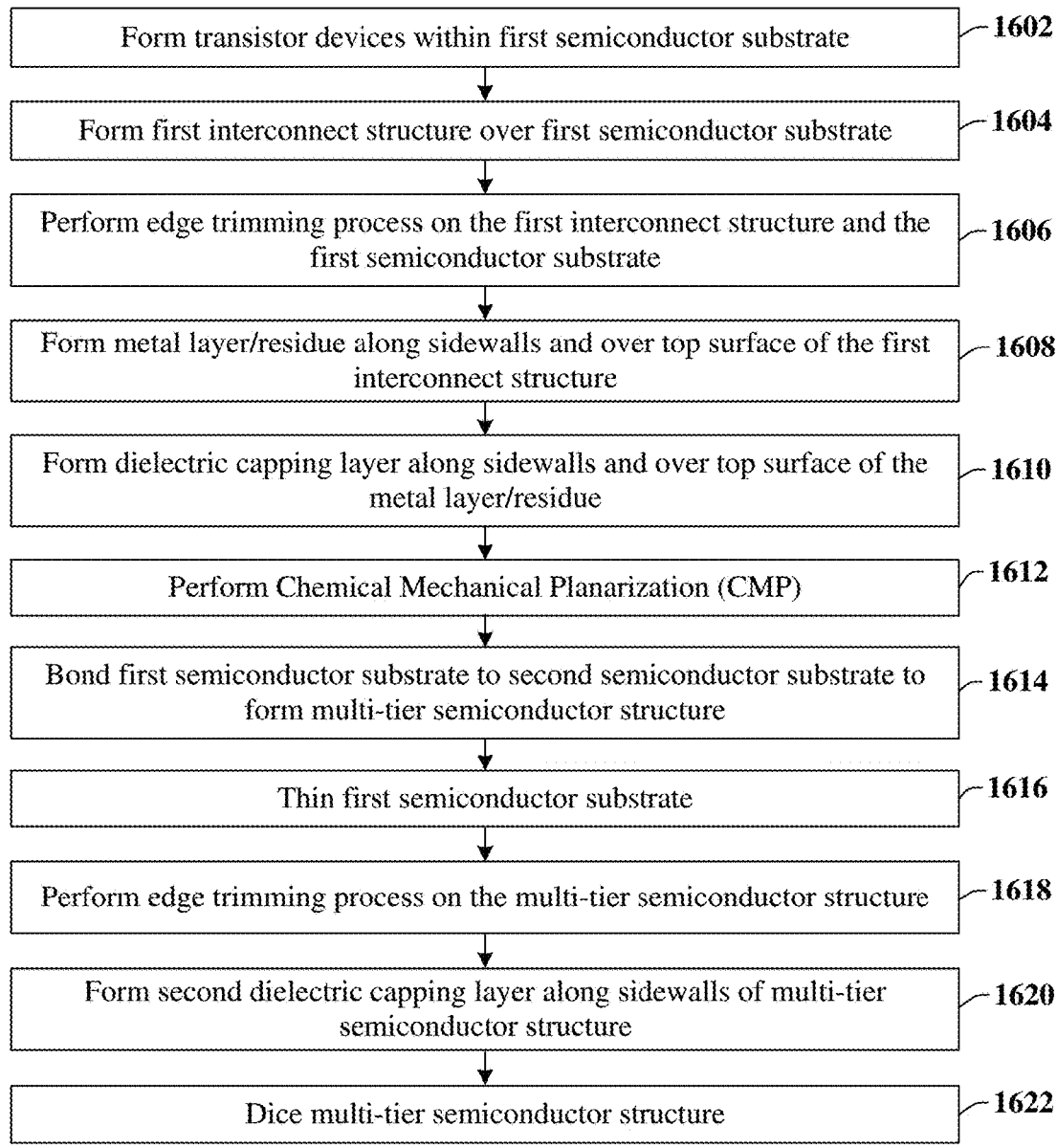
FIG. 16 illustrates a flow diagram of some embodiments of a method of forming an integrated chip structure having a dielectric capping structure.

FIG. 16 illustrates a flow diagram of some embodiments of a method 1600 of forming an integrated chip structure having a dielectric capping structure. While the methods disclosed herein are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, transistors are formed within a first semiconductor substrate. At 1604, a first interconnect structure is formed over the first semiconductor substrate. FIG. 8 illustrates a cross-sectional view 800 of some embodiments corresponding to acts 1602 and 1604.

At 1606, an edge trimming process is performed to remove parts of the first semiconductor substrate and the first interconnect structure along a perimeter of the first semiconductor substrate. FIG. 9 illustrates a cross-sectional view 900 of some embodiments corresponding to act 1606.

At 1608, a metal layer of metal residue is formed along sidewalls and over a top surface of the first interconnect structure. At 1610, a dielectric capping layer is formed along sidewalls and over a top surface of the metal layer of metal residue. FIGS. 10A-10D illustrate various cross-sectional views of some embodiments corresponding to act 1608 and act 1610.

At 1612, chemical mechanical planarization (CMP) is performed to remove an upper portion of the metal layer of metal residue and an upper portion of the dielectric capping layer, thereby exposing an upper surface of the first interconnect structure. FIG. 11 illustrates a cross-sectional view 1100 of some embodiments corresponding to act 1612.

At 1614, the first semiconductor substrate is bonded to a second semiconductor substrate to form a multi-tier semiconductor structure. FIG. 12 illustrates a cross-sectional view 1200 of some embodiments corresponding to act 1614.

At 1616, the first semiconductor substrate is thinned, for example using a grinding operation. This grinding operation, which can also be followed by a CMP, can exposed surfaces of through-substrate-vias (TSVs) through the backside of the first semiconductor substrate to enable electrical connections of additional substrates to the backside of the semiconductor substrate. FIG. 13 illustrates a cross-sectional view 1300 of some embodiments corresponding to act 1616.

At 1618, an edge trimming process is performed to remove parts of the first semiconductor substrate and the first interconnect structure and/or parts of the second semiconductor substrate and the second interconnect structure along a perimeter there of. FIG. 14 illustrates a cross-sectional view 1400 of some embodiments corresponding to act 1618.

At 1620, a second dielectric capping layer is formed along sidewalls of the multi-tier semiconductor structure. This second dielectric capping layer can also limit arcing when the multi-tier semiconductor structure is subjected to a subsequent high power process. FIGS. 15A-15B illustrate cross-sectional views of some embodiments corresponding to act 1620.

At 1622, the multi-tier semiconductor structure is diced into multiple die.

FIG. 17A illustrates a perspective view of some embodiments of a bevel deposition apparatus 1700. The bevel deposition apparatus in this example has a clamshell design that includes an upper chamber 1702 and a lower chamber 1704. The upper chamber 1702 includes an upper extended electrode 1706 that surrounds an upper insulator 1708. An upper plasma exclusion zone (PEZ) ring 1710 surrounds the upper insulator 1708 and separates the upper insulator 1708 from the upper extended electrode 1706. The lower wafer includes an engagement surface to receive a semiconductor wafer 101, and a lower PEZ ring 1712 surrounding the engagement surface. During operation, a semiconductor wafer 101 is placed on an engagement surface 1714 of the lower chamber 1704, and the upper chamber 1702 is closed, thereby establishing a vacuum chamber about the wafer 101. Thus, the semiconductor wafer 101 is disposed vertically between an upper plasma exclusion zone (PEZ) ring 1710 and a lower PEZ ring 1712.

FIG. 17B illustrates a cross-sectional view of some embodiments of the bevel deposition apparatus along the line B-B' of FIG. 17A, illustrating the upper PEZ ring 1710, wafer 101, and lower PEZ ring 1712.

During operation, in some embodiments, a deposition process (e.g., a chemical vapor deposition (CVD) process, plasma enhance CVD, etc.) is utilized to form the dielectric capping structure 110 by loading the semiconductor wafer 101 into the vacuum chamber. Subsequently, one or more processing gas(es) 1720 is/are flowed into the vacuum chamber, with the upper and lower PEZ rings 1710, 1712 in place, such that the dielectric capping structure 110 is selectively deposited over the peripheral region 112 of the semiconductor wafer 101. By virtue of a shape and/or position of the upper PEZ ring 1710, the upper PEZ ring 1710 is configured to prevent the deposition process from depositing the dielectric capping structure 110 over the central region 104 of the semiconductor wafer 101. Further, during the deposition process, the lower PEZ ring 1712 is disposed below the back-side surface of the semiconductor wafer 101 and is configured to prevent the deposition process from depositing the dielectric capping structure 110 on the back-side surface. In some embodiments, the upper PEZ ring 1710 and the lower PEZ ring 1712 comprise a same material such as, for example, yttrium oxide (e.g., $Y_2O_3$) or another suitable material.

Accordingly, in some embodiments, the present disclosure relates to a method of forming an integrated chip structure. In the method, a plurality of interconnect layers are formed within a first interconnect structure disposed over an upper surface of a first semiconductor substrate. An edge trimming process is performed to remove parts of the first interconnect structure and the first semiconductor substrate along a perimeter of the first semiconductor substrate. The edge trimming process results in the first semiconductor substrate having a recessed surface coupled to the upper surface by way of an outer sidewall disposed directly over the first semiconductor substrate. A dielectric capping structure is formed along a sidewall of the first interconnect structure after performing the edge trimming process.

In some embodiments, the present disclosure relates to a method of forming a multi-dimensional integrated chip. In this method, a plurality of interconnect layers are formed within a dielectric structure over an upper surface of a first substrate. A first edge trimming process is performed that removes parts of the dielectric structure and the first substrate along a perimeter of the first substrate. A metal residue layer is formed after the first edge trimming process. The metal residue layer extends over the plurality of interconnect layers. A first dielectric capping structure is formed along sidewalls of the metal residue layer and over an upper surface of the metal residue layer.

In other embodiments, the present disclosure relates to an integrated chip structure. The integrated chip structure includes a first substrate having an upper surface within a central region and a recessed surface within a peripheral region surrounding the central region. The recessed surface laterally extends from the central region to an outermost edge of the first substrate and is vertically between the upper surface and a lower surface of the first substrate opposing the upper surface. A first plurality of interconnect layers is disposed within a first dielectric structure on the upper surface. A metal residue layer is disposed along a sidewall of the first dielectric structure. A first dielectric capping structure is disposed over the recessed surface and along an outer sidewall of the metal residue layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip structure, comprising:
a first substrate having a central region and a bevel region circumferentially surrounding the central region, the central region of the first substrate having a first thickness and the bevel region having a second thickness less than the first thickness;
a first plurality of interconnect layers disposed within a first dielectric structure on the central region of the first substrate; and a first dielectric capping structure disposed over an upper surface of the bevel region, along an outer sidewall of the first dielectric structure, and over an edge portion of an upper surface of the first dielectric structure, the first dielectric capping structure having an innermost sidewall that terminates over the upper surface of the first dielectric structure.

2. The integrated chip structure of claim 1, further comprising:
a metal residue layer disposed along the outer sidewall of the first dielectric structure and sandwiched between the outer sidewall of the first dielectric structure and an inner sidewall of the first dielectric capping structure.

3. The integrated chip structure of claim 2, wherein the metal residue layer comprises copper patches of different sizes and shapes that cover less than an entire upper surface of the first plurality of interconnect layers.

4. The integrated chip structure of claim 1, wherein the first thickness is measured in a direction perpendicular to an upper surface of the central region, and the second thickness is also measured in the direction.

5. The integrated chip structure of claim 1, further comprising:
a second semiconductor substrate disposed over the first plurality of interconnect layers.

6. The integrated chip structure of claim 5, wherein the first dielectric capping structure covers sidewalls of the second semiconductor substrate and extends over an upper surface of the second semiconductor substrate.

7. The integrated chip structure of claim 6, wherein the innermost sidewall of the first dielectric capping structure terminates over the upper surface of the second semiconductor substrate.

8. The integrated chip structure of claim 1, wherein the first dielectric capping structure comprises silicon, silicon oxynitride, silicon nitride, silicon carbide, silicon dioxide, and/or un-doped silicate glass (USG).

9. The integrated chip structure of claim 1, wherein the first dielectric capping structure has a thickness that is greater than or equal to approximately 200 Angstroms.

10. An integrated chip structure, comprising:
a first substrate having a central region and a bevel region circumferentially surrounding the central region, the central region of the first substrate having a first thickness and the bevel region having a second thickness less than the first thickness;
a first plurality of interconnect layers disposed within a first dielectric structure on the central region; and
a first dielectric capping structure disposed over an upper surface of the bevel region, along an outer sidewall of the first dielectric structure, and over an edge portion of an upper surface of the first dielectric structure, wherein the first dielectric capping structure comprises silicon.

11. The integrated chip structure of claim 10, further comprising:
a metal residue layer disposed along the outer sidewall of the first dielectric structure and sandwiched between the outer sidewall of the first dielectric structure and an inner sidewall of the first dielectric capping structure.

12. The integrated chip structure of claim 11, wherein the metal residue layer comprises copper patches of different sizes and shapes that cover less than an entire upper surface of the first plurality of interconnect layers.

13. The integrated chip structure of claim 10, wherein the first thickness is measured in a direction perpendicular to an upper surface of the central region, and the second thickness is also measured in the direction.

14. The integrated chip structure of claim 10, further comprising:
a second semiconductor substrate disposed over the first plurality of interconnect layers.

15. The integrated chip structure of claim 14, wherein the first dielectric capping structure covers sidewalls of the second semiconductor substrate and extends over an upper surface of the second semiconductor substrate.

16. The integrated chip structure of claim 15, wherein an innermost sidewall of the first dielectric capping structure terminates over the upper surface of the second semiconductor substrate.

17. The integrated chip structure of claim 10, wherein the first dielectric capping structure has a thickness that is greater than or equal to approximately 200 Angstroms.

18. An integrated chip structure, comprising:
a first substrate having a central plateau region and a peripheral region perimeterally surrounding the central plateau region, the central plateau region including an uppermost surface that resides above a ledge of the peripheral region, wherein the ledge laterally extends laterally from a lower point on an outer sidewall of the central plateau region toward an outermost edge of the first substrate;
a first plurality of interconnect layers disposed within a first dielectric structure on the central plateau region; and
a first dielectric capping structure disposed over the ledge, along the outer sidewall of the central plateau region, and over upper surface of the central plateau region, wherein the first dielectric capping structure comprises silicon, silicon oxynitride, silicon nitride, silicon carbide, silicon dioxide, and/or un-doped silicate glass (USG).

19. The integrated chip structure of claim 18, further comprising:
a second semiconductor substrate disposed over the first plurality of interconnect layers.

20. The integrated chip structure of claim 19, wherein the first dielectric capping structure covers sidewalls of the second semiconductor substrate and extends over an upper surface of the second semiconductor substrate.

* * * * *